US009053973B2

(12) United States Patent
Sawada et al.

(10) Patent No.: US 9,053,973 B2
(45) Date of Patent: Jun. 9, 2015

(54) SEMICONDUCTOR DEVICE

(71) Applicant: DENSO CORPORATION, Kariya, Aichi-pref. (JP)

(72) Inventors: Kouichi Sawada, Kariya (JP); Yasushi Tanaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/140,650

(22) Filed: Dec. 26, 2013

(65) Prior Publication Data

US 2014/0191421 A1 Jul. 10, 2014

(30) Foreign Application Priority Data

Jan. 7, 2013 (JP) ................................. 2013-000608
Nov. 5, 2013 (JP) ................................. 2013-229502

(51) Int. Cl.
*H01L 23/48* (2006.01)
*H01L 23/00* (2006.01)
*H01L 23/532* (2006.01)
*H01L 23/31* (2006.01)

(52) U.S. Cl.
CPC .......... *H01L 24/11* (2013.01); *H01L 23/53223* (2013.01); *H01L 23/53295* (2013.01); *H01L 23/3114* (2013.01); *H01L 23/3192* (2013.01); H01L 2924/13091 (2013.01); H01L 2924/13055 (2013.01); H01L 2924/1305 (2013.01)

(58) Field of Classification Search
USPC ............ 257/780–782, 784, E23.02, E23.015, 257/E23.132, E23.142
See application file for complete search history.

(56) References Cited

U.S. PATENT DOCUMENTS

| 6,384,486 | B2 * | 5/2002 | Zuniga et al. ................. 257/781 |
| 7,026,547 | B1 | 4/2006 | Goller et al. |
| 7,465,654 | B2 * | 12/2008 | Chou et al. .................... 438/614 |
| 7,626,276 | B2 * | 12/2009 | Hess et al. ..................... 257/779 |
| 2003/0173667 | A1 | 9/2003 | Yong et al. |
| 2003/0173668 | A1 | 9/2003 | Downey et al. |
| 2005/0001314 | A1 | 1/2005 | Tanaka et al. |
| 2005/0067709 | A1 | 3/2005 | Bachman et al. |
| 2007/0052068 | A1 | 3/2007 | Takemura et al. |

(Continued)

FOREIGN PATENT DOCUMENTS

| EP | 0567937 A2 | 11/1993 |
| JP | H05-006915 A | 1/1993 |

(Continued)

OTHER PUBLICATIONS

Office Action mailed Dec. 16, 2014 issued in corresponding JP patent application No. 2013-229502 (and English translation).

*Primary Examiner* — Jasmine Clark
(74) *Attorney, Agent, or Firm* — Posz Law Group, PLC

(57) ABSTRACT

A semiconductor device includes a semiconductor substrate, an interlayer insulation film, multiple wiring layers, a first hard film, and an electrical pad. The semiconductor substrate has a semiconductor element. The interlayer insulation film is disposed above the semiconductor substrate. The multiple wiring layers are disposed within the interlayer insulation film. The first hard film is disposed above the interlayer insulation film, and the first hard film is harder than the interlayer insulation film. The electrical pad is disposed above the first hard film, and the electrical pad is used for an external connection. The electrical pad includes a lower layer pad, the upper layer pad, and a second hard film.

7 Claims, 5 Drawing Sheets

(56) References Cited

U.S. PATENT DOCUMENTS

2010/0314620 A1 12/2010 Furusawa et al.
2012/0199977 A1 8/2012 Yamamoto

FOREIGN PATENT DOCUMENTS

| JP | H06-069272 A | 3/1994 |
| JP | 2004-296643 A | 10/2004 |

* cited by examiner

× CRACK
○ NO CRACK

SEMICONDUCTOR DEVICE

CROSS REFERENCE TO RELATED APPLICATION

This application is based on Japanese Patent Application No. 2013-000608 filed on Jan. 7, 2013 and Japanese Patent Application No. 2013-229502 filed on Nov. 5, 2013, the disclosures of which are incorporated herein by reference.

TECHNICAL FIELD

The present disclosure relates to a semiconductor device.

BACKGROUND

Conventionally, an electrical pad is provided at an upper part of semiconductor device, in which a semiconductor element has formed. The electrical pad is contacted with a probe needle to check a performance of the semiconductor element, or is subjected to a wire bonding connection. For example, a semiconductor device with such a configuration is disclosed in JP-A-2010-153901 (corresponding to US 2003/0173667 A1 and US 2003/0173668 A1).

In JP-A-2010-153901, a semiconductor device (an integrated circuit) is disclosed. In the semiconductor device, a wiring region is formed on a substrate, a passivation layer with multiple openings is formed on the wiring region, and a bonding pad is connected to the wiring region through the multiple openings. The bonding pad has a first wire bonding region and a second wire bonding region. The size of the electrical pad in JP-A-2010-153901 is lager than a size of a normal electrical pad.

The inventors of the present disclosure have found the followings.

In the semiconductor device, which has the electrical pad at the upper part, due to an insertion of the probe needle into the electrical pad or due to an impact occurred when a bonding is performed to the electrical pad, the electrical pad may be scraped, and may become thin. When the electrical pad becomes thin, a stress from the external portion easily propagates to a lower layer of the electrical pad and a difficulty such as a crack or the like may be prone to occur below the electrical pad.

In JP-A-2010-153901, the size of the electrical pad is large, and a probing and a bonding are performed at different places. However, when a strong impact is applied to the electrical pad at one time, or when impacts are applied repeatedly, the impact may not be absorbed by the electrical pad. The stress may propagate to the lower layer of the electrical pad and the crack may occur.

SUMMARY

It is an object of the present disclosure to provide a semiconductor device, which suppresses a stress propagation toward a lower part of the electrical pad.

According to an aspect of the present disclosure, the semiconductor device includes a semiconductor substrate, an interlayer insulation film, multiple wiring layers, a first hard film, and an electrical pad. The semiconductor substrate has a semiconductor element. The interlayer insulation film is disposed above the semiconductor substrate. The multiple wiring layers are disposed within the interlayer insulation film. The first hard film is disposed above the interlayer insulation film. The first hard film is harder than the interlayer insulation film. The electrical pad is disposed above the first hard film and used for an external connection. The electrical pad includes a lower layer pad, an upper layer pad, and a second hard film. The lower layer pad is disposed closer to the semiconductor substrate than the upper layer pad. The upper layer pad is disposed further from the semiconductor substrate. The second hard film is disposed between the lower layer pad and the upper layer pad. The second hard film has conductivity and is harder than the lower layer pad and the upper layer pad.

According to the above semiconductor device, it is possible to suppresses a stress propagation toward a lower part of the electrical pad.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

First Embodiment

Figure 1:
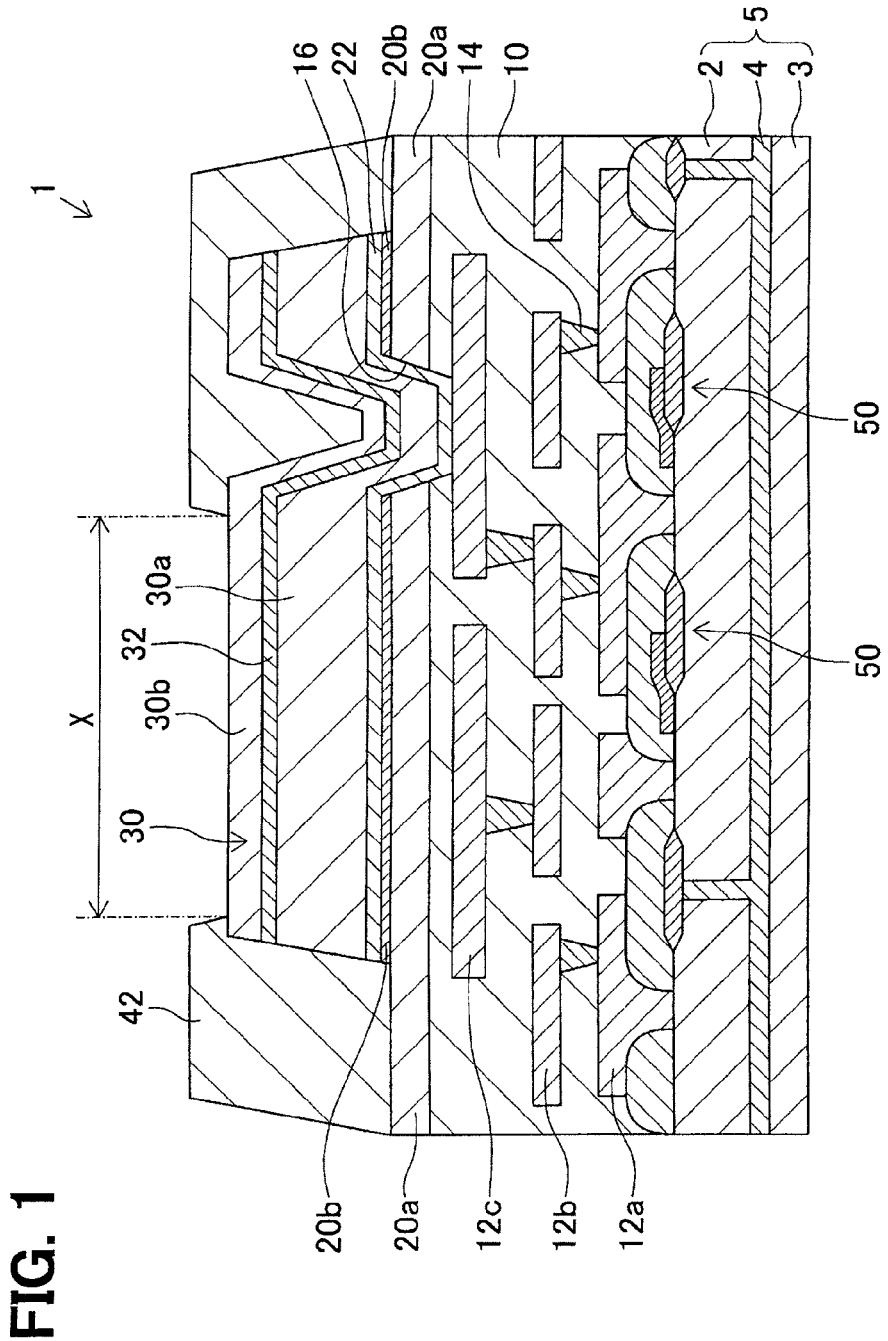
FIG. 1 is a cross sectional view illustrating a semiconductor device according to a first embodiment.
Figure 2A:
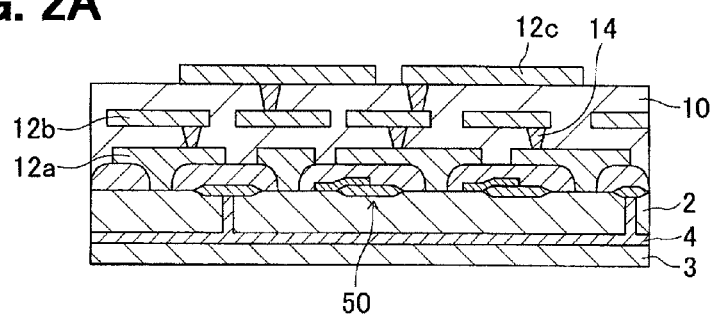
FIGS. 2A to 2C are cross sectional views illustrating a manufacturing process of the semiconductor device according to the first embodiment.
Figure 2B:
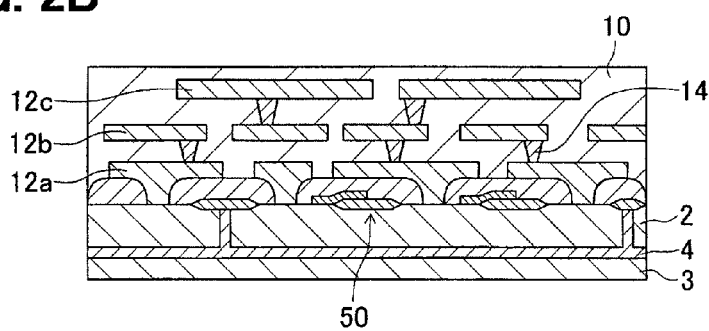
Figure 2C:
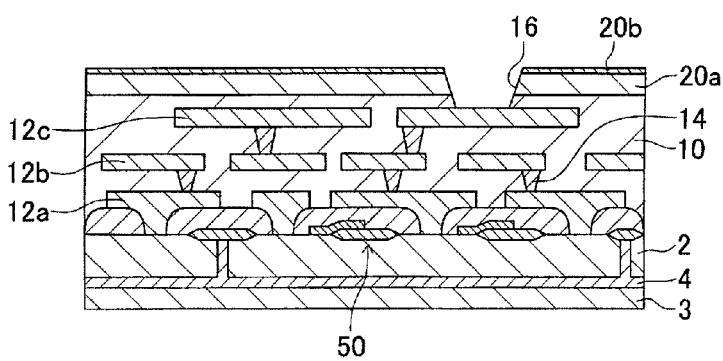
Figure 3A:
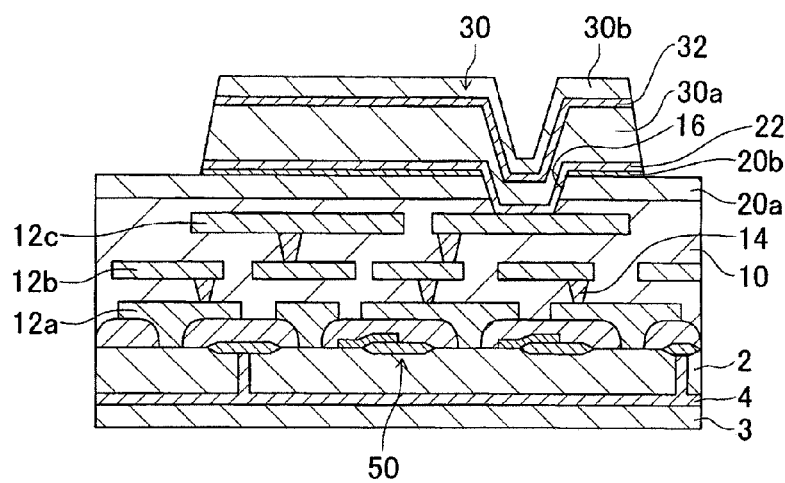
FIGS. 3A and 3B are cross sectional views illustrating the manufacturing process of the semiconductor device according to the first embodiment.
Figure 3B:
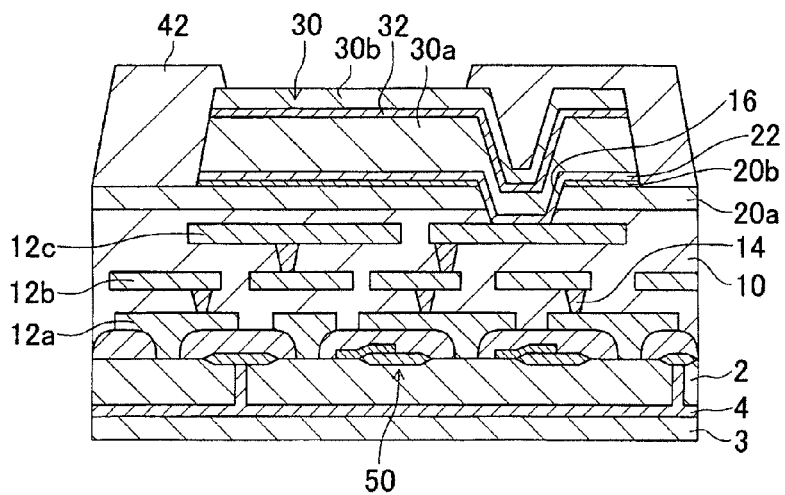

The first embodiment of the present disclosure will be explained as following. As described in FIG. 1, in a semiconductor device 1 in the present embodiment, multiple semiconductor elements 50 such as a lateral diffused MOS (LD-MOS), an insulated gate type bipolar transistor (IGBT), or the like are formed on a silicon-on-insulator (SOI) substrate 5. On a semiconductor element 50, an interlayer insulation film 10, a wiring layers 12a to 12c, a first hard film 20a, a barrier metal film 22, and an electrical pad 30 are formed in order. The SOI substrate 5 is configured from a SOI layer 2, a P-type support substrate 3, and a buried oxide film 4, for example. The SOI layer 2, which is configured from N-type silicon, and the P-type support substrate 3 are joined through the buried oxide film 4. The SOI substrate 5 corresponds to an example of a semiconductor substrate. In the present disclosure, a thickness direction of the semiconductor substrate (e.g., the SOI substrate 5) corresponds to a vertical direction (in other words, an up-and-down direction). Thus, when it is supposed that one of two main surfaces in the semiconductor substrate corresponds to a surface layered by the interlayer insulation film 10 and the wiring layers 12a to 12c, the one of two main surfaces corresponds to an up direction. The other of the two main surfaces (corresponding to a surface with the P-type support substrate 3) corresponds to a down direction.

On the semiconductor element 50, the interlayer insulation film 10 is formed. The interlayer insulation film 10 is made from a spin-on-glass (SOG) film, a borophosphosilicate glass (BPSG) film, a tetraethoxysilane (TEOS) film, or the like. In the interlayer insulation film 10, the first wiring layer 12a, the second wiring layer 12b, and the third wiring layer 12c are formed from the SOI layer 2 in order. The wiring layers 12a to 12c mainly include aluminum (Al), for example. In addition, in the interlayer insulation film 10, multiple vias 14 are provided, and each of the wiring layers 12a to 12c and the semiconductor element 50 are electrically connected by the vias 14.

The first hard film 20a is formed above the interlayer insulation film 10 and the wiring layers 12a to 12c, so that the first hard film 20a covers the interlayer insulation film 10 and the wiring layers 12a to 12c. The Young's modulus of the first hard film 20a is 240 GPa. The first hard film 20a is formed by a passivation film, which is harder than a main part, such as the TEOS film, of the interlayer insulation film 10. The passivation film corresponds to a silicon nitride film, for example. Incidentally, the Young's modulus of the main part of the interlayer insulation film 10 is smaller than the Young's modulus of the first hard film 20a. For example, the Young's modulus of the TEOS film is 70 GPa. The first hard film 20a includes P—SiN film, which is provided by a plasma chemical vapor deposition (CVD) method, and has about 1.0 μm thickness. On the first hard film 20a, silicon oxide films 20b are layered to improve an adhesion strength with a barrier metal film 22. The silicon oxide film 20b includes the TEOS film, which is provided by a CVD method, or the like and has about 0.23 μm thickness, for example.

The barrier metal film 22 is formed on the silicon oxide film 20b. Specifically, the barrier metal film 22 is layered on the silicon oxide film 20b so that the barrier metal film 22 almost covers the silicon oxide film 20b in at least a bonding region X. The barrier metal film 22 is disposed to suppress a metal migration of Al, which is used in the electrical pad 30, Au, which corresponds to a bonding material, or the like. The barrier metal film 22 is made of a material with a relatively high melting point, and corresponds to titanium, titanium alloys (e.g., titan nitride and titan tungsten), tungsten, tungsten alloys, copper, copper alloys, tantalum, tantalum alloys, zirconium, or zirconium alloys, for example. The barrier metal film 22 may include two or more types of layers. For example, it may be possible that a titanium nitride film of 0.1 μm thickness and a titanium film of 0.02 μm thickness are layered in the barrier metal film 22.

Figure 4A:
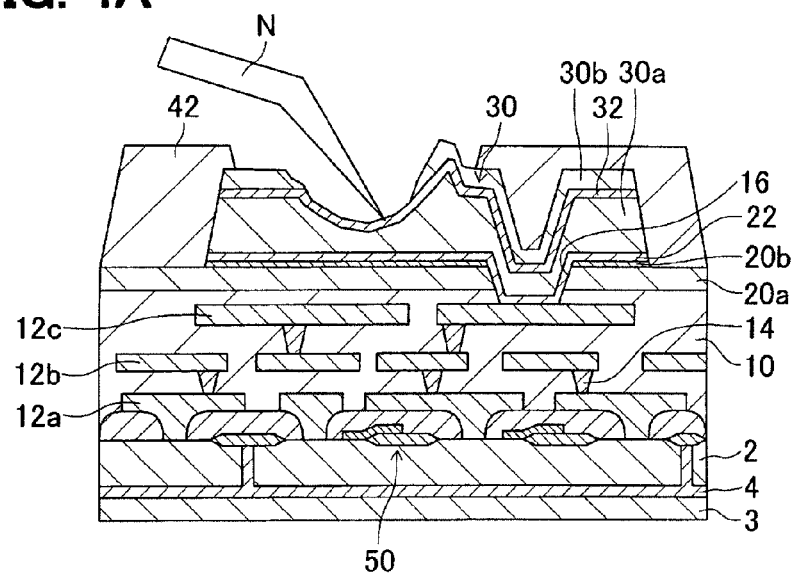
FIGS. 4A and 4B are cross sectional views illustrating a manufacturing process of the semiconductor device according to the first embodiment.
Figure 4B:
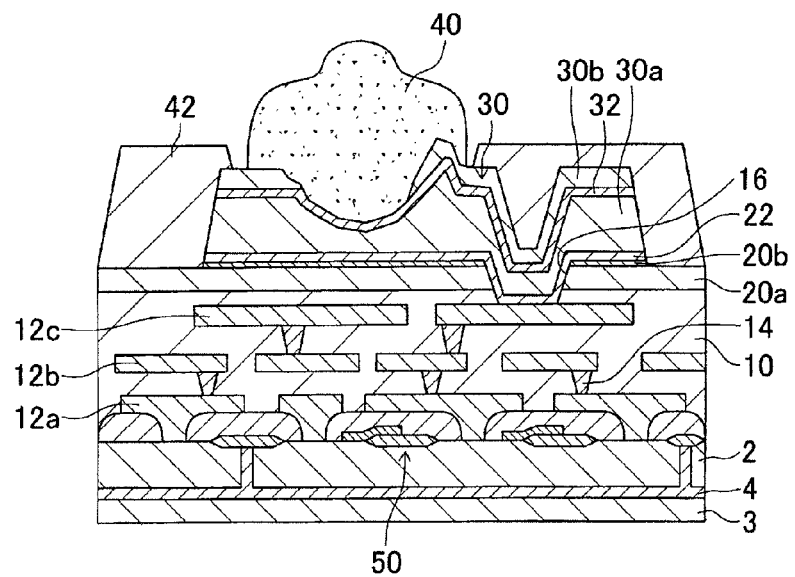

Above the barrier metal film 22 (corresponding to an upper side of the first hard film 20a), the electrical pad 30 is provided for connecting with the external portion. A conductive part such as the bonding part 40 may be connected on the upper side of the electrical pad 30. Incidentally, FIG. 1 is a diagram before the bonding part 40 is connected. FIG. 4B is a diagram after the bonding part 40 has been connected. The electrical pad 30 includes a lower layer pad 30a and an upper layer pad 30b. The lower layer pad 30a is disposed closer to the semiconductor substrate (corresponding to a lower side) than the upper layer pad 30b. The upper layer pad 30b is disposed above the lower layer pad 30a. The second hard film 32 is disposed between the lower layer pad 30a and the upper layer pad 30b. The second hard film 32 has conductivity and electrically connects the lower layer pad 30a and the upper layer pad 30b. The second hard film 32 is harder than the lower layer pad 30a and the upper layer pad 30b. The second hard film 32 is layered on the lower layer pad 30a so that the second hard film 32 almost covers an upper surface of the lower layer pad 30a in at least a bonding region X. In addition, the lower layer pad 30a is also layered to cover the barrier metal film 22 in the at least bonding region X. Incidentally, the bonding region X corresponds to a region where the bonding part 40 connects with the electrical pad 30, and is exposed to the outside of a surface protection film 42 without being covered by the surface protection film 42.

The lower layer pad 30a and the upper layer pad 30b are, for example, films whose Young's modulus are less than 80 GPa. The lower layer pad 30a and the upper layer pad 30b mainly made of aluminum, aluminum alloys, or the like. The second hard film 32 is a film, whose Young's modulus is equal to or more than 80 GPa. The second hard film 32 mainly includes titanium, titanium alloys, tungsten, tungsten alloys, copper, copper alloys, tantalum, tantalum alloys, zirconium, zirconium alloys, or the like.

As described in FIG. 1, the lower layer pad 30a is configured to be thicker than the upper layer pad 30b. The second hard film 32 is disposed above a center portion of the electrical pad 30 in a cross section perpendicular to one surface of the SOI substrate 5. In other words, the second hard film 32 is disposed above a center of the electrical pad 30 in a thickness direction of the electrical pad 30. Incidentally, the thickness direction is perpendicular to a surface of the SOI substrate 5. In the present embodiment, the thickness of the lower layer pad 30a is set to 3.3 μm, the thickness of the upper layer pad 30b is set to 1.3 μm, and the thickness of the second hard film 32 is set to 0.1 μm. Incidentally, for example, the thickness of the lower layer pad 30a may be equal or more than 2.9 μm preferably. the thickness of the upper layer pad 30b may be equal or more than 1.0 μm preferably. The thickness of the second hard film 32 may be equal or more than 0.07 μm preferably. As described above, since the lower layer pad 30a is thicker than the upper layer pad 30b, it is possible to absorb the impact by the lower layer pad 30a.

The first hard film 20a and the interlayer insulation film 10 have a contact hole portion 16 for electrically connecting between the electrical pad 30 and the wiring layer 12c. The contact hole portion 16, as described in FIG. 1, is disposed apart from the bonding region X, where the bonding part 40 is connected at the electrical pad 30. The contact hole portion 16 penetrates the first hard film 20a or the like. The electrical pad 30 fills up the inside of the contact hole portion 16. The bonding part 40 is electrically connected to the wiring layer 12c through the contact hole portion 16. Specifically, the second hard film 32 and the lower layer pad 30a are layered within the contact hole portion 16. The barrier metal film 22 outside the contact hole portion 16 is layered above the first hard film 20a through the silicon oxide film 20b. The barrier metal film 22 at the contact hole portion 16 is disposed within the contact hole portion 16, and is connected to the wiring layer 12c below a position corresponding to the first hard film 20a. As described above, the contact hole portion 16 is disposed apart from the bonding region X, so that it is possible to scatter the stress. Incidentally, the contact hole portion 16 corresponds to an example of a contact portion.

The bonding part 40 is made of metal different from the electrical pad 30, and for example, is made of gold, copper, or the like. The bonding part 40 is connected to the above described bonding region X by using a bonder or the like.

Manufacturing process of the semiconductor device 1 will be explained with reference to FIG. 2A to FIG. 4B. A SOI substrate in which multiple semiconductor elements 50 are formed on one side of the substrate surfaces is prepared. A semiconductor element 50 is provided by a well-known method. Above each of the semiconductor elements 50, the first wiring layer 12a, the second wiring layer 12b, and the third wiring layer 12c are formed in this order. The interlayer insulation film 10 is inserted among the wiring layers 12a to 12c. Each of the wiring layers 12a to 12c is formed by a deposition of Al with sputtering method (referring to FIG.

2A). The interlayer insulation film 10 is formed by a deposition of $SiO_2$ with a chemical vapor deposition (CVD) method (referring to FIG. 2B).

On the interlayer insulation film 10, a P—SiN film of about 1.0 μm thickness is deposited by a plasma CVD method, and the first hard film 20a is provided. On the first hard film 20a, a TEOS film of 0.23 μm thickness is deposited by the CVD method, and the silicon oxide film 20b is provided. The contact hole portion 16 is formed by etching at a position which is apart from a region (corresponding to the bonding region X) to be connected with the bonding part 40 (referring to FIG. 2C).

The barrier metal film 22 is formed on the silicon oxide film 20b. The barrier metal film 22 is formed by the sputtering method, in which a titanium nitride film of 0.1 μm thickness is deposited and then a titanium film of 0.02 μm thickness is deposited. The electrical pad 30 is formed on the barrier metal film 22. An Al layer of 3.3 μm thickness is deposited by the sputtering method, and the lower layer pad 30a is provided. On the lower layer pad 30a, a Ti layer of 0.1 μm thickness is deposited by the sputtering method, and the second hard film 32 is provided. On the second hard film 32, an Al layer of 1.3 μm thickness is deposited, and the upper layer pad 30b is provided (referring to FIG. 3A). A surface protection film 42 of 10 μm thickness is formed to cover a part other than the bonding region X of the electrical pad 30 (in other words, only a part corresponding to the bonding region X is opened, referring to FIG. 3B). The surface protection film 42 is made of polyimide (PIQ), for example.

The probe needle N contacts to the bonding region X of the electrical pad 30, and a function of the semiconductor element 50 or the like (referring to FIG. 4A) is inspected. In an inspection, due to the impact by the probe needle N, the upper layer pad 30b may become thin. Since the probe needle N slides on the second hard film 32, the impact to a lower side of the electrical pad 30 is dispersed and mitigated, so that it is possible to prevent the lower layer pad 30a from being scraped. Therefore, the lower layer pad 30a remains at the bonding region X, and the semiconductor device 1 is manufactured by performing a bonding connection with the bonding part 40, with using a bonder (not shown).

Figure 5:
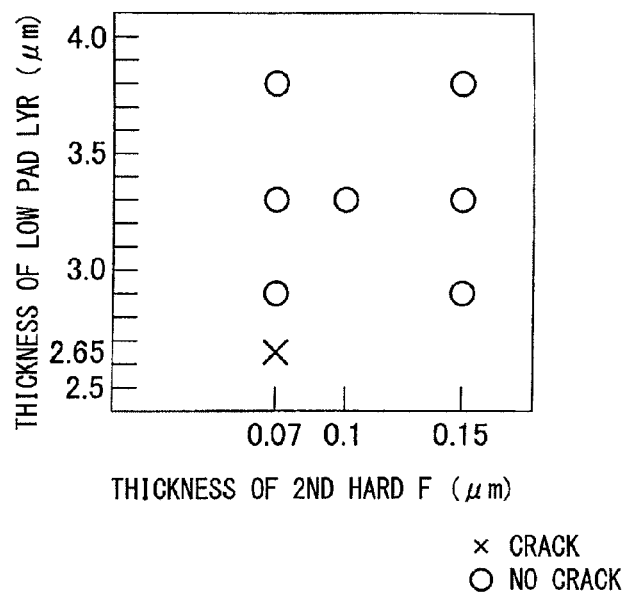
FIG. 5 is a diagram illustrating a relationship among a thickness of a lower layer pad, a thickness of a second hard film, and a crack occurrence.
Figure 6:
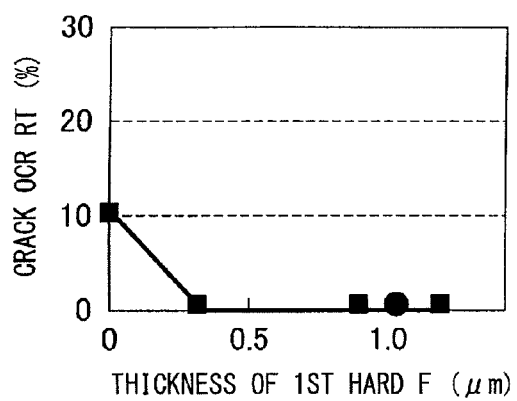
FIG. 6 is a diagram illustrating a relationship between a thickness of a first hard film and an occurrence rate of the crack.

Regarding to the semiconductor device 1, technical advantages by the second hard film 32 and the first hard film 20a will be explained with referring to FIG. 5 and FIG. 6. Incidentally, FIG. 5 illustrates a relationship between a thickness of the lower layer pad 30a, the thickness of the second hard film 32, and a crack occurrence. FIG. 6 illustrates a relationship between a thickness of a first hard film 20a and an occurrence rate of the crack. Incidentally, a square symbol in FIG. 6 illustrates an experimental result in a condition where, in the electrical pad 30 having the lower layer pad 30a of 1.3 μm thickness without the upper layer pad 30b and the second hard film 32, the thickness of the first hard film 20a has been changed. A circle symbol in FIG. 6 illustrates an experimental result in a condition where, in the electrical pad 30 having the upper layer pad 30b of 1.3 μm thickness, the second hard film 32 of 0.1 μm thickness, and the lower layer pad 30a of 3.3 μm thickness, the first hard film 20a has 1.0 μm thickness, corresponding to a condition which is described in FIG. 2A to FIG. 4B.

It was studied whether, when the electrical pad 30 is bonded with the bonding part 40, any cracks occur below the electrical pad 30 of the semiconductor device 1, manufactured according to the above manner. As shown in FIG. 5, when the thickness of the lower layer pad 30a is equal to or more than 2.9 μm thickness and the thickness of the second hard film 32 is equal to or more than 0.07 μm thickness, it is observed that the crack does not occur. In addition, it is observed that, when the lower layer pad 30a becomes thin, e.g., 2.65 μm thickness, there is a possibility that the crack may occur even when the second hard film 32 of 0.07 μm thickness is disposed. Therefore, in order to surely prevent the crack occurrence, even when the second hard film 32 is disposed, it is necessary that the thickness of the lower layer pad 30a is equal to or more than a predetermined thickness (corresponding to 2.9 μm in the present embodiment).

In an inspection process before the bonding process, the probe needle N may contact with the electrical pad 30 many times. According to a manner to contact with the electrical pad 30, a part of the upper layer pad 30b may be scraped and in addition, the second hard film 32 under the part of the upper layer pad 30b may also be scraped. For example, when the lower layer pad 30a of 1.3 μm thickness remains, and the first hard film 20a is not disposed (i.e., corresponding to the first hard film 20a of zero μm thickness), the crack occurrence rate may be about 10%, as shown in FIG. 6. Therefore, even when the electrical pad 30 having the second hard film 32 is formed, in a case where the first hard film 20a is not disposed under the second hard film 32, the second hard film 32 may be scraped and the crack may occur. When the first hard film 20a is disposed, as shown in FIG. 6, the crack may not occur in a condition where the lower layer pad 30a of 1.3 μm thickness remains. Therefore, by placing the second hard film 32 and the first hard film 20a below the second hard film 32, it is possible to surely prevent the crack occurrence even when the upper part of the electrical pad 30 is scraped.

As explained above, in the semiconductor device 1 according to the first embodiment, the second hard film 32 is interposed within the electrical pad 30. Therefore, when the stress is applied to the electrical pad 30 from an upper part, corresponding to a case when the prove needle N is inserted or a bonding is performed, it is possible that the second hard film 32 suppresses a stress propagation to a lower part of the electrical pad 30. Therefore, it is possible to prevent difficulties such as the crack or the like at the lower part of the electrical pad 30, and to effectively protect the lower part of the electrical pad 30. In addition, the lower layer pad 30a and the first hard film 20a are disposed below the second hard film 32, and it may be possible to reduce the stress propagation. Especially, the second hard film 32 may prevent the lower layer pad 30a from being scraped, and therefore, it may be possible to improve the protection effect of the lower layer pad 30a and the first hard film 20a.

Incidentally, the lower layer pad 30a is thicker than the upper layer pad 30b, and the second hard film 32 is disposed above a center of the electrical pad 30 in a thickness direction of the electrical pad 30. Herein, the thickness direction is perpendicular to a surface of the SOI substrate 5. In other words, the second hard film 32 is disposed above the center of the electrical pad 30 in the cross section perpendicular to the one side surface of the SOI substrate 5. When the probe needle N is inserted into the upper layer pad 30b in the inspection, the probe needle N contacts to the second hard film 32. In this case, since the upper layer pad 30b is relatively thin, the amount of insertion of the probe needle N inserted into the upper layer pad 30b may be decreased compared with a case where the upper layer pad 30b is relatively thick. As described above, when the amount of the insertion is decreased, a drag by the upper layer pad 30b may be decreased when the probe needle N slides on the second hard film 32. It is possible to suppress the stress propagation to the second hard film 32 by the impact, compared with a case when (i) the amount of the insertion is large, (ii) the probe needle N does not slide on the second hard film 32, and (iii)

the impact through the probe needle N is directly applied to the second hard film 32. Herein, the case when the amount of the insertion is large corresponds to a case where the upper layer pad 30b is relatively thick. Therefore, it is possible to prevent the second hard film 32 and the lower layer pad 30a from being scraped in the inspection with the probe needle N. It is possible to suppress the stress propagation to a lower side of the electrical pad 30.

The barrier metal film 22 is disposed below the electrical pad 30. The silicon oxide film 20b is disposed between the first hard film 20a, which is made of the silicon nitride film, and the barrier metal film 22. The silicon oxide film 20b sticks the first hard film 20a and the barrier metal film 22. By disposing the silicon oxide film 20b at a boundary of the first hard film 20a and the barrier metal film 22, it is possible to improve adhesion strength between the first hard film 20a and the barrier metal film 22. In addition, by disposing the barrier metal film 22, it is possible to suppress a migration (i.e., a diffusion of metal to the wiring layer 12c) of metal disposed at the electrical pad 30 or the like.

Incidentally, the electrical pad 30 and the wiring layers 12a to 12c are electrically connected through the contact hole portion 16. The contact hole portion 16 penetrates the first hard film 20a at a position which is apart from the bonding region X at which the bonding part 40 is connected in the electrical pad 30. According to this configuration, it may be possible that the first hard film 20a is disposed below the bonding region X, and it is possible to suppress the stress propagation to a lower side of the electrical pad 30.

Incidentally, the semiconductor element 50 is disposed below the electrical pad 30. Normally, a region (corresponding a region below the bonding region X) below the electrical pad 30 may be apt to receive the impact, so that it is difficult to provide the semiconductor element 50. However, in the present disclosure, the second hard film 32 is disposed between the lower layer pad 30a and the upper layer pad 30b, and furthermore, the electrical pad 30 is disposed above the first hard film 20a. Accordingly, it is possible to suppress the stress propagation to the lower side of the electrical pad 30. Therefore, it is possible to form the semiconductor element 50 at the region below the electrical pad 30, and it may be possible to reduce the whole size of the semiconductor device 1.

The lower layer pad 30a below the bonding part 40 is remained between the bonding part 40 and the first hard film 20a, and the bonding region X of the electrical pad 30 is connected to the bonding part 40. Since the bonding region X is connected to the bonding part 40 with remaining the lower layer pad 30a, it is possible to suppress the stress propagation to a region below the lower layer pad 30a.

Incidentally, the electrical pad 30 and the bonding part 40 are configured from different kinds of metals each other. Since the electrical pad 30 and the bonding part 40 are configured from different kinds of metals, the stress from the bonding part 40 does not easily propagate to the electrical pad 30. Therefore, it is possible to suppress the crack occurrence more effectively.

Another Embodiment

The present disclosure is not limited to the above embodiment, which is described by the description and the drawings. For example, the following embodiment is included in a technical scope of the present disclosure.

In the above embodiment, the second hard film 32 is disposed above the center of the electrical pad 30 in the thickness direction of the electrical pad 30. However, a position of the second hard film 32 is not limited to this configuration. The second hard film 32 may be disposed at the center of the electrical pad 30 in the thickness direction of the electrical pad 30, or may be disposed under the center of the electrical pad 30 in the thickness direction of the electrical pad 30.

In the above embodiment, the electrical pad 30 and the bonding part 40 are made of different kinds of metals each other. However, the electrical pad 30 and the bonding part 40 may be made of the same kind of metal.

In the above embodiment, the lower layer pad 30a at the bonding region X of the electrical pad 30 is remained, when the bonding region X is connected to the bonding part 40. However, the second hard film 32 may also be remained in addition to the lower layer pad 30a below the bonding part 40, and furthermore, the upper layer pad 30b may also be remained.

A semiconductor device includes a semiconductor substrate, an interlayer insulation film, multiple wiring layers, a first hard film, and an electrical pad. The semiconductor substrate has a semiconductor element. The interlayer insulation film is disposed above the semiconductor substrate. The multiple wiring layers are disposed within the interlayer insulation film. The first hard film is disposed above the interlayer insulation film. The first hard film is harder than the interlayer insulation film. The electrical pad is disposed above the first hard film and used for an external connection. The electrical pad includes a lower layer pad, an upper layer pad, and a second hard film. The lower layer pad is disposed closer to the semiconductor substrate than the upper layer pad. The upper layer pad is disposed further from the semiconductor substrate. The second hard film is disposed between the lower layer pad and the upper layer pad. The second hard film has conductivity and is harder than the lower layer pad and the upper layer pad.

According to the semiconductor device in the present disclosure, the second hard film is interposed within the electrical pad. Thus, when a stress is applied from the above to the electrical pad in an insertion of a probe needle or a bonding process, it is possible to suppress the stress propagation toward a lower part of the electrical pad due to the second hard film. Therefore, it is possible to prevent difficulties such as the crack or the like at the lower part of the electrical pad, and to effectively protect the lower part of the electrical pad. In addition, since the lower layer pad and the first hard film are disposed below the second hard film, it is possible to reduce the stress propagation. Especially, due to the second hard film, it is possible to prevent the lower layer pad from being scraped. Thus, it is possible to improve a protection effect by the lower layer pad and the first hard film.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:
1. A semiconductor device comprising:
a semiconductor substrate having a semiconductor element;
an interlayer insulation film disposed above the semiconductor substrate;
a plurality of wiring layers disposed within the interlayer insulation film;

a first hard film disposed above the interlayer insulation film, the first hard film being harder than the interlayer insulation film; and an electrical pad disposed above the first hard film and used for an external connection, wherein the electrical pad includes:

a lower layer pad disposed closer to the semiconductor substrate;

an upper layer pad disposed further from the semiconductor substrate; and a second hard film disposed between the lower layer pad and the upper layer pad, and wherein the second hard film has conductivity and is harder than the lower layer pad and the upper layer pad.

2. The semiconductor device according to claim 1, wherein the lower layer pad is thicker than the upper layer pad, and wherein the second hard film is disposed above a center of the electrical pad in a thickness direction of the electrical pad, the thickness direction is perpendicular to a surface of the semiconductor substrate.

3. The semiconductor device according to claim 1, further comprising a barrier metal film disposed between the electrical pad and the first hard film, and a silicon oxide film disposed between the barrier metal film and the first hard film, wherein the first hard film is made from a silicon nitride film, and wherein the silicon oxide film directly contacts with the barrier metal film and the first hard film.

4. The semiconductor device according to claim 1, wherein the semiconductor element is disposed between the electrical pad and the semiconductor substrate.

5. The semiconductor device according to claim 1, wherein the electrical pad has a bonding region connected with the external connection through a bonding part, wherein a contact portion penetrates the first hard film at a position which is apart from the bonding region, and wherein the electrical pad and the plurality of wiring layers are electrically connected through the contact portion.

6. The semiconductor device according to claim 5, wherein the electrical pad and the bonding part are made from different kinds of metals each other.

7. The semiconductor device according to claim 6, wherein the semiconductor element is electrically connected with the plurality of wiring layers.

* * * * *